(12) United States Patent
Borrelli et al.

(10) Patent No.: US 10,439,109 B2
(45) Date of Patent: Oct. 8, 2019

(54) LUMINESCENT COATINGS AND DEVICES

(71) Applicant: CORNING INCORPORATED, Corning, NY (US)

(72) Inventors: Nicholas Francis Borrelli, Elmira, NY (US); Nadja Teresia Lonnroth, Corning, NY (US); Wageesha Senaratne, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 14/910,391

(22) PCT Filed: Jul. 31, 2014

(86) PCT No.: PCT/US2014/048995
§ 371 (c)(1),
(2) Date: Feb. 5, 2016

(87) PCT Pub. No.: WO2015/020859
PCT Pub. Date: Feb. 12, 2015

(65) Prior Publication Data
US 2016/0181482 A1     Jun. 23, 2016

Related U.S. Application Data

(60) Provisional application No. 61/862,279, filed on Aug. 5, 2013.

(51) Int. Cl.
*H01L 33/50* (2010.01)
*H01L 33/48* (2010.01)
(Continued)

(52) U.S. Cl.
CPC ......... *H01L 33/504* (2013.01); *C09K 11/025* (2013.01); *C09K 11/7734* (2013.01);
(Continued)

(58) Field of Classification Search
CPC ..... H01L 33/50; H01L 33/501; H01L 33/502; H01L 33/504; H01L 33/507
(Continued)

(56) References Cited

U.S. PATENT DOCUMENTS

| 4,513,024 A | 4/1985 | Morita et al. |
|---|---|---|
| 5,541,248 A | 7/1996 | Haluska et al. |

(Continued)

FOREIGN PATENT DOCUMENTS

| CN | 1953216 A | 4/2007 |
|---|---|---|
| DE | 102008021438 A1 | 12/2009 |

(Continued)

OTHER PUBLICATIONS

Won, et al., "Effect of phosphor geometry on the luminous efficiency of high-power white light-emitting diodes with excellent color rendering property", Optics Letters, vol. 34, No. 1, Jan. 1, 2009, pp. 1-3.

(Continued)

*Primary Examiner* — Matthew E Warren

(57) ABSTRACT

A method of combining a first phosphor material and a second phosphor material and devices made therefrom. The method includes providing a first phosphor material, combining the first phosphor material with a host matrix to create a first phosphor mixture, curing the first phosphor mixture at one or more predetermined temperatures, and depositing the cured first phosphor mixture onto a substrate having a second phosphor material. The first phosphor material includes red emission phosphor particles and the second phosphor material includes yellow emission phosphor particles and the host matrix includes a silsesquioxane host material, silsesquioxane-silicate host material, a sol gel host material, or an alkali/silicate water glass host material.

25 Claims, 11 Drawing Sheets

(51) Int. Cl.
*C09K 11/02* (2006.01)
*C09K 11/77* (2006.01)
*C09K 11/88* (2006.01)

(52) U.S. Cl.
CPC .......... *C09K 11/7774* (2013.01); *C09K 11/88* (2013.01); *H01L 33/505* (2013.01); *H01L 33/486* (2013.01); *H01L 33/501* (2013.01); *H01L 33/507* (2013.01); *H01L 2224/48465* (2013.01); *H01L 2924/16195* (2013.01); *H01L 2933/0041* (2013.01)

(58) Field of Classification Search
USPC .................................................. 257/98, 100
See application file for complete search history.

(56) References Cited

U.S. PATENT DOCUMENTS

| | | | |
|---|---|---|---|
| 5,635,249 | A | 6/1997 | Haluska et al. |
| 6,572,785 | B2 | 6/2003 | Justel et al. |
| 7,282,270 | B2 | 10/2007 | Morita et al. |
| 7,319,289 | B2 | 1/2008 | Suehiro et al. |
| 7,811,471 | B2 | 10/2010 | Iwao et al. |
| 7,825,575 | B2 | 11/2010 | Sawanobori et al. |
| 7,989,236 | B2 | 8/2011 | Yamaguchi et al. |
| 8,206,613 | B2 | 6/2012 | Fujita et al. |
| 8,297,783 | B2 | 10/2012 | Kim |
| 8,343,379 | B2 | 1/2013 | Naum et al. |
| 8,344,404 | B2 | 1/2013 | Fujita et al. |
| 8,547,010 | B2 | 10/2013 | Jagt |
| 9,011,720 | B2 | 4/2015 | Aitken et al. |
| 2004/0012027 | A1 | 1/2004 | Keller et al. |
| 2005/0253130 | A1 | 11/2005 | Tsutsumi et al. |
| 2008/0074029 | A1 | 3/2008 | Suehiro |
| 2008/0231170 | A1* | 9/2008 | Masato ................ C09K 11/565 313/501 |
| 2008/0284315 | A1 | 11/2008 | Tasumi et al. |
| 2009/0173960 | A1 | 7/2009 | Martin et al. |
| 2009/0186433 | A1 | 7/2009 | Yamaguchi et al. |
| 2010/0237766 | A1 | 9/2010 | Baumgartner et al. |
| 2010/0263723 | A1 | 10/2010 | Allen et al. |
| 2012/0107622 | A1 | 5/2012 | Borrelli et al. |
| 2012/0193604 | A1 | 8/2012 | Kim et al. |
| 2012/0267998 | A1 | 10/2012 | Sohn et al. |
| 2012/0286701 | A1 | 11/2012 | Yang et al. |
| 2012/0293981 | A1 | 11/2012 | Motoya et al. |
| 2012/0305970 | A1 | 12/2012 | Kim |
| 2012/0306356 | A1 | 12/2012 | Yoon et al. |
| 2012/0319565 | A1 | 12/2012 | Sakuta et al. |
| 2013/0015761 | A1 | 1/2013 | Motoya et al. |
| 2013/0033167 | A1 | 2/2013 | Dong et al. |
| 2013/0049575 | A1 | 2/2013 | Fujita et al. |
| 2013/0170179 | A1 | 7/2013 | Kadomi et al. |
| 2013/0320264 | A1 | 12/2013 | Yoshida et al. |
| 2014/0072812 | A1* | 3/2014 | Hamada ............. H01S 5/02296 428/432 |

FOREIGN PATENT DOCUMENTS

| | | |
|---|---|---|
| EP | 0582716 A1 | 8/1993 |
| EP | 1880983 A1 | 1/2008 |
| EP | 2036965 A1 | 3/2009 |
| EP | 2120271 A1 | 11/2009 |
| EP | 2202284 B1 | 10/2012 |
| EP | 2549555 A2 | 1/2013 |
| JP | 2003258308 A | 9/2003 |
| JP | 2007013513 A | 4/2007 |
| JP | 2007116133 A | 5/2007 |
| JP | 2008169348 A | 7/2008 |
| JP | 20100050438 A | 3/2010 |
| JP | 2010087267 A | 4/2010 |
| JP | 2011171585 A | 9/2011 |
| JP | 2011228344 A | 11/2011 |
| JP | 2012031328 A | 2/2012 |
| JP | 2012158494 A | 8/2012 |
| JP | 2012180488 A | 9/2012 |
| JP | 2013140848 A | 7/2013 |
| KR | 2010135223 A | 12/2010 |
| WO | 20090234864 A1 | 3/2009 |
| WO | 2011013505 A1 | 2/2011 |
| WO | 2011065322 A1 | 6/2011 |
| WO | 2011111462 A1 | 9/2011 |
| WO | 2012100132 A1 | 7/2012 |
| WO | 2012111765 A1 | 8/2012 |
| WO | 2013001971 A1 | 1/2013 |

OTHER PUBLICATIONS

Diez-Blanco, et al., "Waveguide structures written in SF57 glass with fs-laser pulses above the critical self-focusing threshold", Applied Surface Science, 252 (2006) pp. 4523-4526.
Mueller-Mach, et al., "Highly efficient all-nitride phosphor-converted white light emitting diode", phys. stat. sol. (a) 202, No. 9, 1727-1732 (2005).
Park, et al., "Enhanged Luminescence Efficiency for Bi, Eu doped Y2O3 Red Phosphors for White LEDs", Trans Tech Publications, Solid State Phenomena vols. 124-126 (2007) pp. 379-382.
Xie, et al., "Rare-Earth Activated Nitride Phosphors: Synthesis, Luminescence and Applications", Materials 2010, 3, 3777-3793.
Xie, et al., "Silicon-based oxynitride and nitride phosphors for white LEDs—A review", Science and Technology of Advanced Materials 8 (2007) 588-600.
English Translation of CN201480054979.9 First Office Action dated Jan. 11, 2017, China Patent Office.
English Translation of CN201480054979.9 Second Office Action dated Nov. 9, 2017, China Patent Office.
English Translation of JP2016533331 Office Action dated Jul. 3, 2018; 7 Pages; Japanese Patent Office.
English Translation of CN201480054979.9 Office Action dated May 18, 2018; 13 Pages; Chinese Patent Office.

\* cited by examiner

Random structure

Ladder structure

Cage structures
($T_8$)

Cage structures
($T_{10}$)

Cage structures
($T_{12}$)

LUMINESCENT COATINGS AND DEVICES

CROSS-REFERENCE TO RELATED APPLICATIONS

This application claims the benefit of priority under 35 U.S.C. § 371 of International Patent Application Serial No. PCT/US14/48995, filed on Jul. 31, 2014, which in turn, claims the benefit of priority of U.S. Provisional Patent Application Ser. No. 61/862,279, filed on Aug. 5, 2013, the contents of each of which are relied upon and incorporated herein by reference in their entireties.

BACKGROUND

This application claims the benefit of priority to U.S. Application No. 61/862,279 filed on Aug. 5, 2013 the content of which is incorporated herein by reference in its entirety.

Various embodiments of electroluminescent lamps or devices are known in which white light is generated based on light emitting diodes (LEDs). One embodiment is based on the use of conversion luminophores, commonly referred to as phosphors. Other embodiments employ quantum dots. A portion of the primary emission of an LED (mostly blue in the wavelength range of approximately 460 nm) can be absorbed by the phosphor and emitted again as secondary radiation in a higher wavelength. Emission wavelengths generally vary from 500 nm (green) to 630 nm (red). If a phosphor is employed with emission of a complementary color, white emission can be realized additively.

To produce warm white light (2700-3500K), however, red phosphors should be used in combination with yellow phosphors. Due to the broad emission of red phosphors and relatively lower efficiency thereof the red phosphors, conventional solutions provide insufficient color rendition, inefficient utilization of the radiometric energy (radiant power) and technically complex constructions.

SUMMARY

The disclosure generally relates to lighting and, more particularly, to LEDs, LED lamps, and electroluminescent devices having high efficiency and high color rendition.

Some embodiments provide an LED module for lighting applications having a high efficiency and high color rendition. Exemplary embodiments incorporate red phosphors that can be deposited onto a yellow phosphor substrate whereby the addition of a second fluorescent color broadens the color space of the emitted light allowing adjustment of the emitted color by suitable mixing of the blue, yellow and red contributions.

Some embodiments provide an arrangement such as a wavelength conversion plate for converting an input wavelength to an output wavelength. The wavelength conversion plate includes a first phosphor layer including first phosphor particles distributed throughout a first matrix, and a second phosphor layer including second phosphor particles distributed throughout a second matrix whereby the second phosphor layer is in physical contact with the first phosphor layer and the second matrix includes a siloxane or silsesquioxane host material, a silsequioxane-silicate host material, a sol gel host material, or an alkali/silicate water glass host material.

Additional embodiments provide a lighting device having at least one light emitting diode adapted to emit primary light having a peak wavelength in the visible spectrum, and a multi-layer structure having a first phosphor layer including first phosphor particles distributed throughout a first matrix and a second phosphor layer including second phosphor particles distributed throughout a second matrix. The second phosphor layer is in physical contact with the first phosphor layer and the second matrix includes a siloxane or silsesquioxane host material, a silsequioxane-silicate host material, a sol gel host material, or an alkali/silicate water glass host material.

Further embodiments provide a lighting device having at least one light emitting diode adapted to emit primary light having a peak wavelength in the visible spectrum, and a multi-layer structure having a first phosphor layer including yellow emission phosphor particles distributed throughout a first matrix and a second phosphor layer in contact with the first phosphor layer and including red emission phosphor particles distributed throughout a second matrix. The second matrix includes a siloxane or silsesquioxane host material, a silsequioxane-silicate host material, a sol gel host material, or an alkali/silicate water glass host material, and the second phosphor layer does not include ceramic oxide precursors.

Various embodiments also include a method of combining a first phosphor material and a second phosphor material. The method includes providing a first phosphor material, combining the first phosphor material with a host matrix to create a first phosphor mixture, curing the first phosphor mixture at one or more predetermined temperatures, and depositing the cured first phosphor mixture onto a substrate having a second phosphor material.

Additional features and advantages of the claimed subject matter will be set forth in the detailed description which follows, and in part will be readily apparent to those skilled in the art from that description or recognized by practicing the claimed subject matter as described herein, including the detailed description which follows, the claims, as well as the appended drawings.

It is to be understood that both the foregoing general description and the following detailed description of various embodiments of the present disclosure, are intended to provide an overview or framework for understanding the nature and character of the claimed subject matter. The accompanying drawings are included to provide a further understanding of the present disclosure, and are incorporated into and constitute a part of this specification. The drawings illustrate various embodiments and together with the description serve to explain the principles, operations, and variations of the claimed subject matter.

BRIEF DESCRIPTION OF THE DRAWINGS

These figures are provided for the purposes of illustration, it being understood that the embodiments disclosed and discussed herein are not limited to the arrangements and instrumentalities shown.

While this description can include specifics for the purpose of illustration and understanding, these should not be construed as limitations on the scope, but rather as descriptions of features that can be including in and/or illustrative for particular embodiments.

DETAILED DESCRIPTION

Various embodiments for luminescent coatings and devices are described with reference to the figures, where like elements have been given like numerical designations to facilitate an understanding.

It also is understood that, unless otherwise specified, terms such as "top," "bottom," "outward," "inward," and the like are words of convenience and are not to be construed as limiting terms. In addition, whenever a group is described as comprising at least one of a group of elements and combinations thereof, the group can comprise, consist essentially of, or consist of any number of those elements recited, either individually or in combination with each other.

Similarly, whenever a group is described as consisting of at least one of a group of elements or combinations thereof, the group can consist of any number of those elements recited, either individually or in combination with each other. Unless otherwise specified, a range of values, when recited, includes both the upper and lower limits of the range. As used herein, the indefinite articles "a," and "an," and the corresponding definite article "the" mean "at least one" or "one or more," unless otherwise specified Those skilled in the art will recognize that many changes can be made to the embodiments described while still obtaining the beneficial results of the invention. It also will be apparent that some of the desired benefits of the present disclosure can be obtained by selecting some of the described features without using other features. Accordingly, those of ordinary skill in the art will recognize that many modifications and adaptations are possible and can even be desirable in certain circumstances and are part of the invention. Thus, the following description is provided as illustrative of the principles of the present disclosure and not in limitation thereof.

Those skilled in the art will appreciate that many modifications to the exemplary embodiments described herein are possible without departing from the spirit and scope of the invention. Thus, the description is not intended and should not be construed to be limited to the examples given but should be granted the full breadth of protection afforded by the appended claims and equivalents thereto. In addition, it is possible to use some of the features of the present disclosure without the corresponding use of other features. Accordingly, the foregoing description of exemplary or illustrative embodiments is provided for the purpose of illustrating the principles of the present disclosure and not in limitation thereof and can include modification thereto and permutations thereof.

Figure 1:
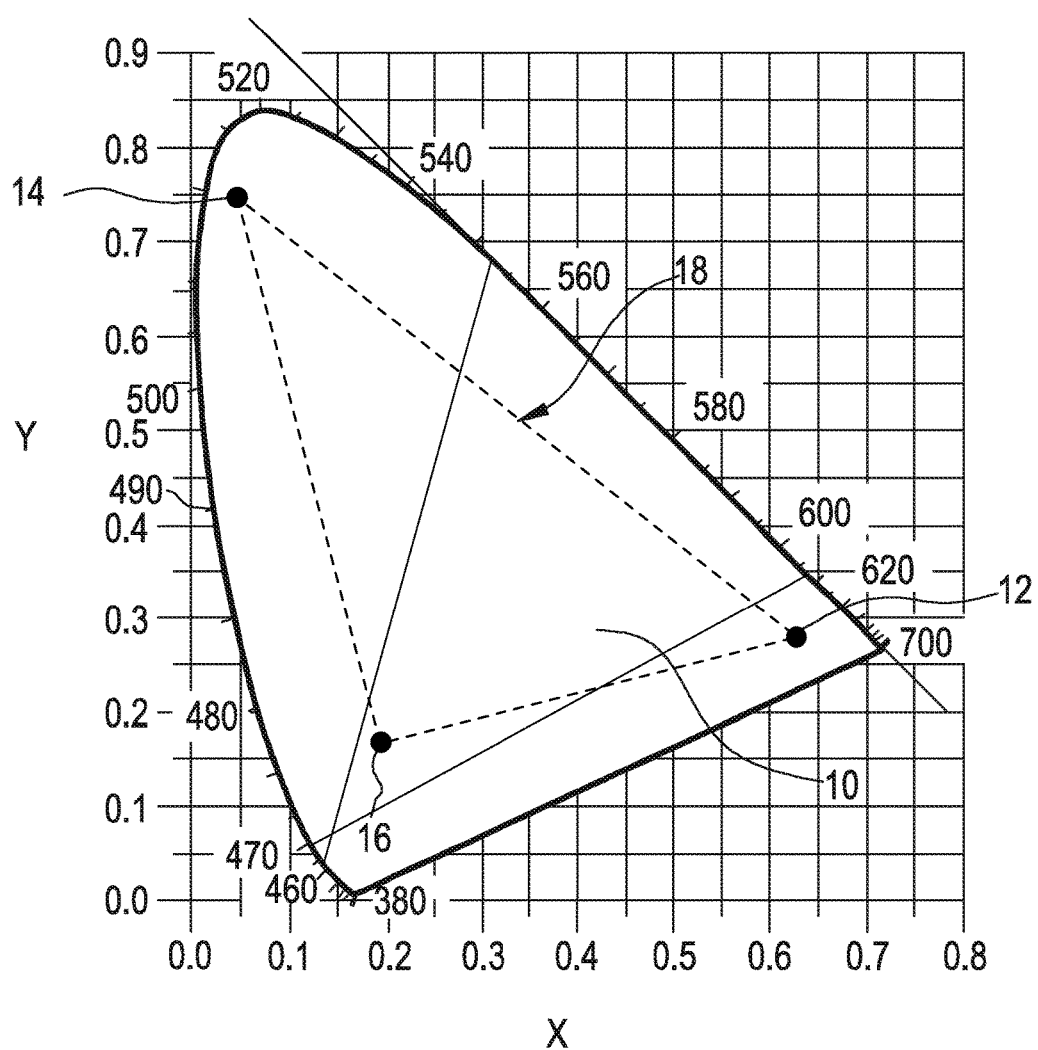
FIG. 1 is a chromaticity plot showing various color points convolved with eye response.
Figure 2A:
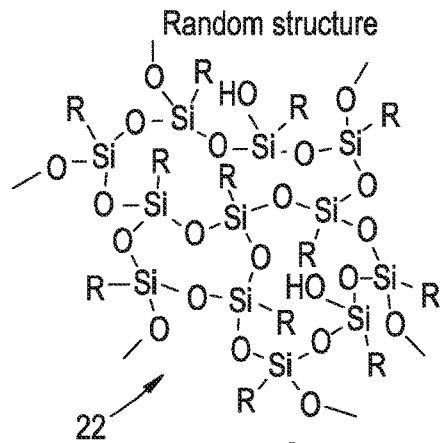
FIGS. 2A-2F are illustrations of various silsequiloxane host materials according to exemplary embodiments.
Figure 2B:
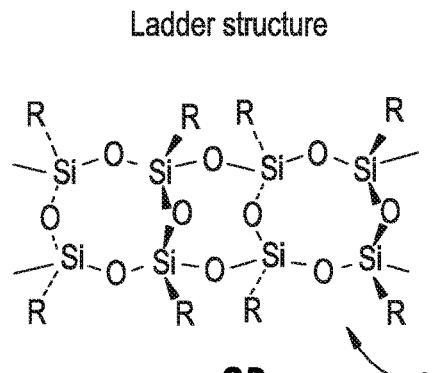
Figure 2C:
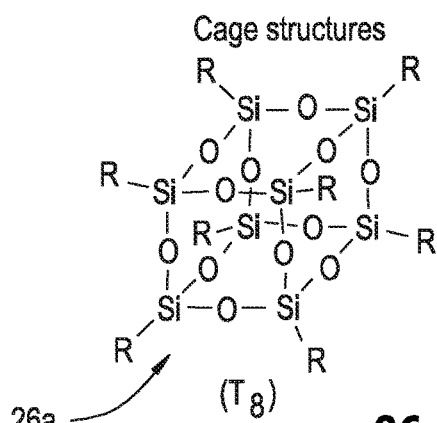
Figure 2D:
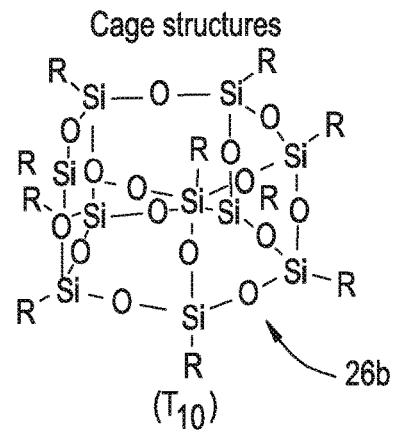
Figure 2E:
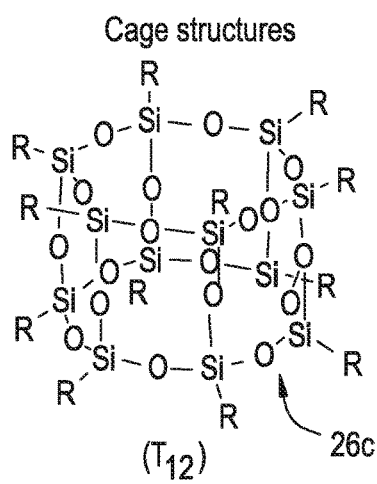
Figure 2F:
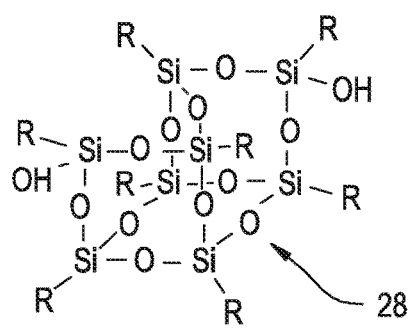

LED-based devices generally employ a GaN-based blue LED emitter at approximately 460 nm in conjunction with a yellow emitting Ce/YAG phosphor at approximately 560 nm. FIG. 1 is a chromaticity plot showing various color points convolved with eye response. With reference to FIG. 1, it can be seen that the combination of transmitted blue light and a yellow fluorescence can generally produce a white color 10. The characterization of this combined color is called the color point and is illustrated as an x-y point on a tri-stimulus diagram convolved with the eye response. In cases where less than pure colors of red 12, green 14 and blue 16 are provided, colors can be produced anywhere within a triangle 18 by varying the relative intensities of the respective colors. With only two wavelengths of 460 nm (blue) and 560 nm (green/yellow), one is generally constrained to a line connecting the two points and, thus, the colors obtainable are considerably restricted. To produce white light close to that emitted from an incandescent bulb, for example, a source of red light is required. Thus, embodiments of the present disclosure incorporate a source of red emitting phosphor to achieve a desirable white emission 10.

Incorporation of red emitting phosphors, however, presents a challenge due to the thermal stability and reactivity of red phosphor with hosts of the available high quantum efficiency red phosphor materials. Some embodiments generally are directed to producing red emitting phosphors compatible with LED lighting structures and electroluminescent devices. Exemplary processes of producing such red emitting phosphors are described below and can be employed to produce sintered ceramics, glass-ceramics, silicone/phosphor blends and thin glass/phosphor composites, to name a few. Additional exemplary processes are also described in co-pending U.S. application Ser. No. 13/852, 048, entitled "Bismuth Borate Glass Encapsulant for LED Phosphors," filed Mar. 28, 2013, the entirety of which is incorporated herein by reference.

Exemplary embodiments of the present disclosure incorporate red phosphors that can be deposited onto a yellow phosphor substrate whereby the addition of a third fluorescent color broadens the color space of the emitted light allowing adjustment of the emitted color by suitable mixing of the blue, yellow and red contributions. Conventionally, the incorporation of a source of red emitting phosphor presented a challenge because of the thermal stability and reactivity with host materials of the red phosphor and/or quantum dot materials. It should be noted that the terms host and host materials are used interchangeably herein and such use should not limit the scope of the claims appended herewith. For example, such conventional methods can increase degradation concerns of the resulting device as the materials in the device can undergo chemical reactions with the environment or host thereby resulting in a loss of quantum efficiency at high temperatures. Thus, an exemplary red phosphor process should be robust and compatible with processes used to form an underlying yellow phosphor (YAG) substrate.

A source of red emitting phosphors with a host that can be applied as a coating onto yellow phosphor containing materials without substantially affecting its quantum efficiency can be used. Exemplary red phosphors that can be used include, but are not limited to, $(SrBaMg)2SiO_4:Eu$, $M(AlSi)N_3:Eu$ where M is Ca, Sr, or Ba, CaS:Eu, as well as other suitable red phosphors. Exemplary phosphors can also include oxide phosphors, sulfide phosphors, nitride phosphors according to the respective conversion wavelength. For example, exemplary phosphors can include yellow emission phosphors based on β-SiAlON:Eu,Re, silicate-based green emission phosphors such as (Ba,Sr,Ca,Mg)$_2$SiO$_4$:Eu,Re, or sulfide-based green emission phosphors such as (Ba,Sr,Ca,Mg) (Ga,Al,In)$_2$(S,Se,Te)$_4$:Eu,Re, nitride-based red emission phosphors such as (Sr,Ca,Ba,Mg)AlSiN$_x$:Eu,Re (1≤x≤5), or sulfide-based red emission phosphors such as (Sr,Ca,Ba,Mg) (S,Se,Te):Eu,Re where Re can be any one of Nd, Pm, Sm, Tb, Dy, Ho, Er, Tm, Yb, F, Cl, Br, and I.

An exemplary host for red phosphor materials can include a silsesquioxane host. Silsesquioxanes or siloxanes are materials having a general formula of RSiO$_{3/2}$, where R represents an organic group (or H) bonded to silica through a Si—C bond. There are a myriad of silsesquioxane host structures including, but not limited to a random structure 22, a ladder structure 24, cage structures 26a, 26b, 26c and partial cage structures 28 as illustrated in FIGS. 2A-2F. In some embodiments a silsesquioxanes host also can have an additional silicate functionality.

Red phosphor material can be added in the range of 1-10% by weight to an exemplary silicate-methyl siloxane polymer to create a slurry. In some embodiments, the loading or concentration of red phosphor can range from about 1% to about 30% by weight, e.g., 1, 2, 5, 10, 15, 20 or 30 percent. Silicate-methyl siloxane polymer is generally a prepolymerized version of a silicate-silsesquioxane and therefore can be applied onto a substrate and cured to form a silicate-silsesquioxane where the silsesquioxane can have the structure(s) illustrated in FIGS. 2A-2F. For example, in some embodiments, methylsiloxanes form a ladder silsesquioxane when cured. Further, in the prepolymer stage an exemplary red phosphor material can be added to an exemplary silicate-methyl siloxane polymer.

Figure 3:
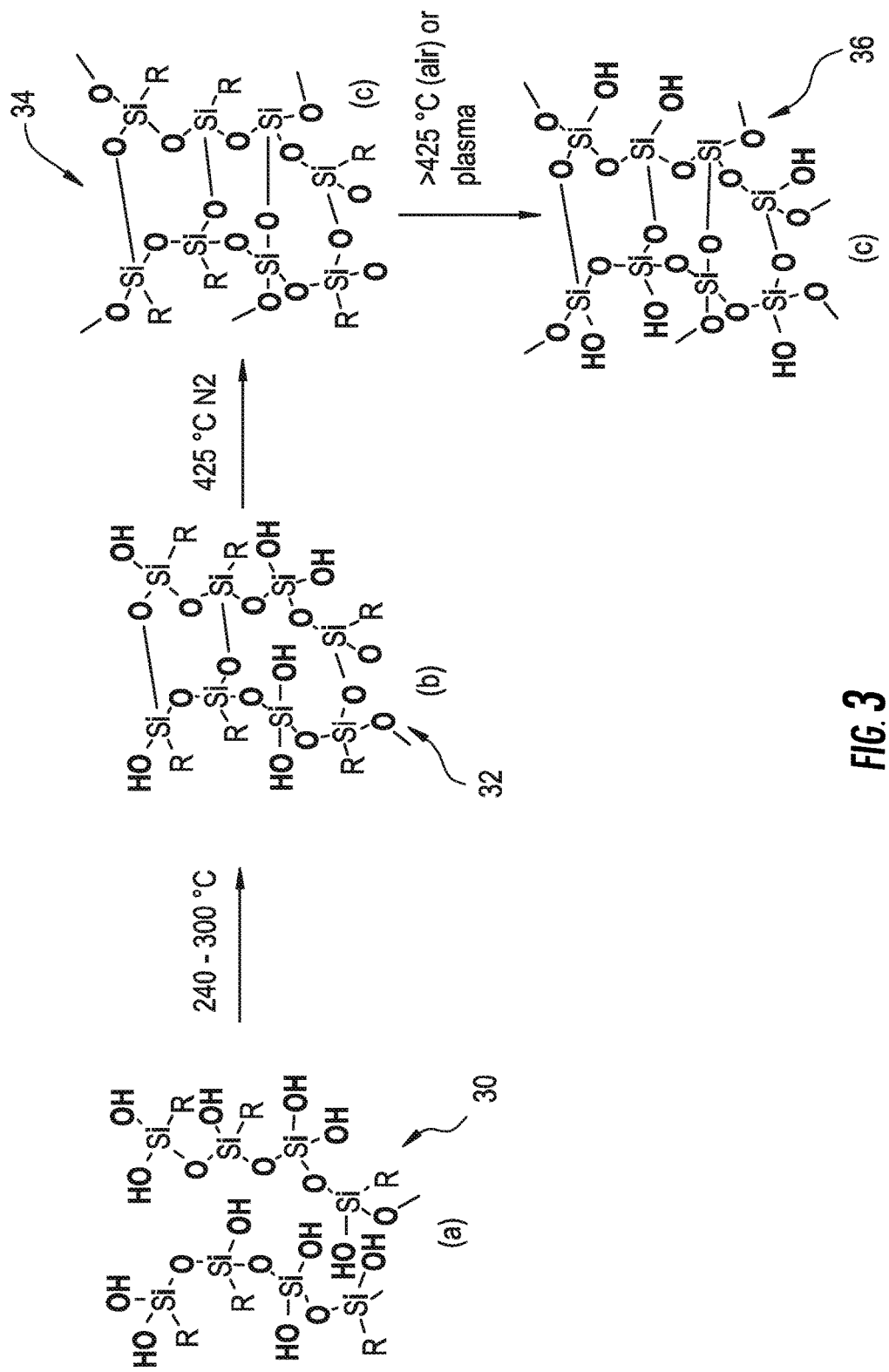
FIG. 3 is an illustration of an exemplary curing process according to some embodiments.

FIG. 3 is an illustration of an exemplary curing process according to some embodiments of the present disclosure. With reference to FIG. 3, an exemplary silicate-methyl siloxane polymer can comprise a first, non-limiting, structure 30 having a plurality of silanols (Si—OH) that can undergo condensation at higher temperatures. When the polymer is cured at, for example, approximately 240° C. to 300° C., a partially condensed structure 32 results. The polymer can then reach a condensed structure 34 at approximately 425° C. in N$_2$ where the Si—R groups are still present in the condensed network. In another embodiment, when the curing is conducted in air some of the Si—R groups can be converted to silanols. For example, to convert the Si—R groups to Si—OH, the polymer material can be cured at a higher temperature, e.g., greater than 425° C. in air, or can be treated with an oxygen plasma creating another condensed structure 36 whereby partial oxidation of methyls occur. In such an example, complete oxidation of methyls can occur at approximately 600° C.

The silicate-silsesquioxane can be deposited onto a substrate having a yellow phosphor material by, for example, spin coating, spraying, dip coating, screen printing or another suitable method of deposition capable of controlling the thickness of the silicate-silsesquioxane layer, compatible with the underlying substrate, and capable of curing to obtain a condensed structure as desired.

Exemplary coatings as described herein can provide a low surface energy coating having less than about 50 mJ/m$^2$. In some embodiments, the deposited coating can have a low surface energy of less than 40 mJ/m$^2$ and even less than 30 mJ/m$^2$. One embodiment provides a low surface energy coating of approximately 34 mJ/m$^2$. In another embodiment, a silicate or silicate-silsesquioxane coating without any phosphor material can be provided on top of the deposited red phosphor coating to form a capping layer prior to curing.

Figure 4A:
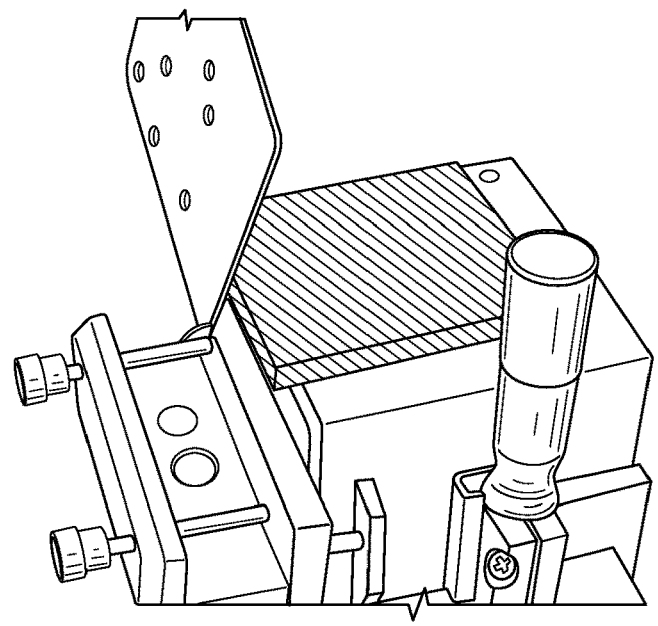
FIGS. 4A-4C provide pictorial depictions of an exemplary coating formed from embodiments.
Figure 4B:
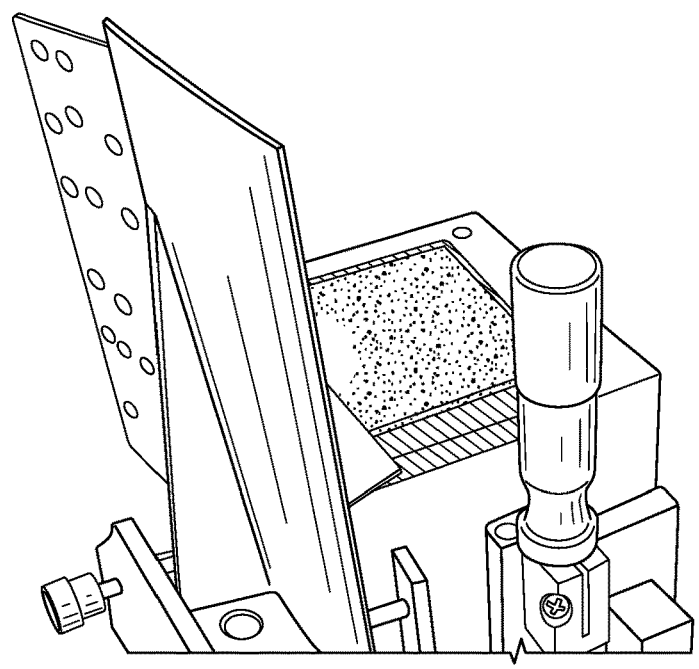
Figure 4C:
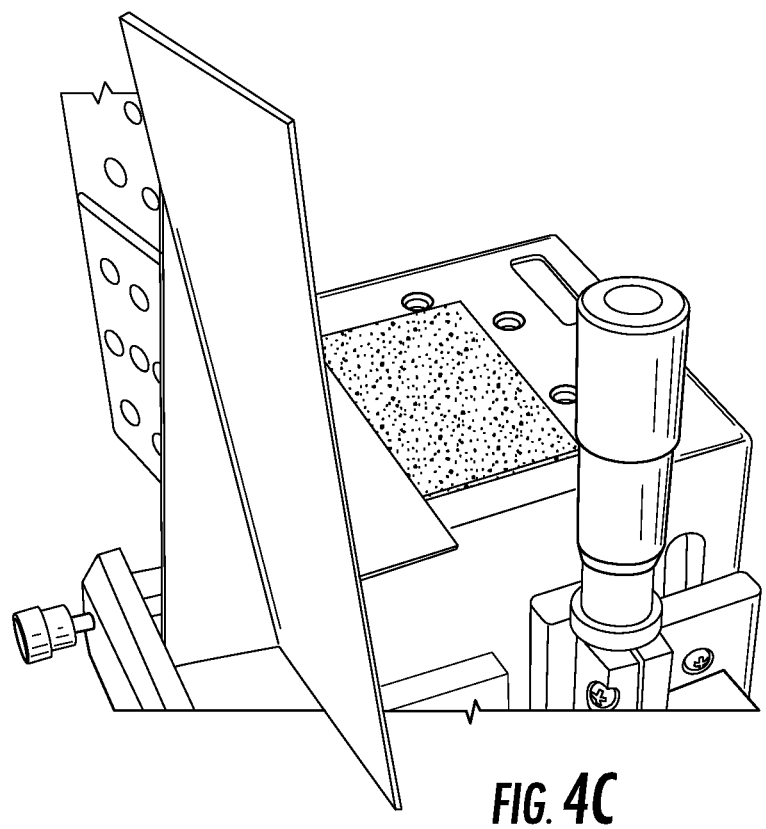

FIGS. 4A-4C provide pictorial depictions of an exemplary coating containing red phosphor material formed from the method described above. With reference to FIG. 4A, exemplary fluorescence with a 460 nm LED excitation source is illustrated having an approximately 10% by weight loading of red Eu-nitride phosphor in a silsesquioxane host heated at 430° C. for 1 hour in air. With reference to FIG. 4B, exemplary fluorescence with an approximately 460 nm LED excitation source is illustrated having a 10% by weight loading of red (SrCaMg)SiO$_4$:Eu phosphor in a silsesquioxane host. A slurry was formed, spin coated to a thickness of approximately 1-4 μm, and then heated at 430° C. for 1 hour in air. With reference to FIG. 4C, exemplary fluorescence with an approximately 460 nm LED excitation source is illustrated having a 10% by weight loading of red CaS:Eu phosphor in a silsesquioxane host heated at approximately 430° C. for 1 hour in air. As illustrated, the samples depicted in FIGS. 4A-4C each exhibit fluorescence at the desired color point.

Figure 5:
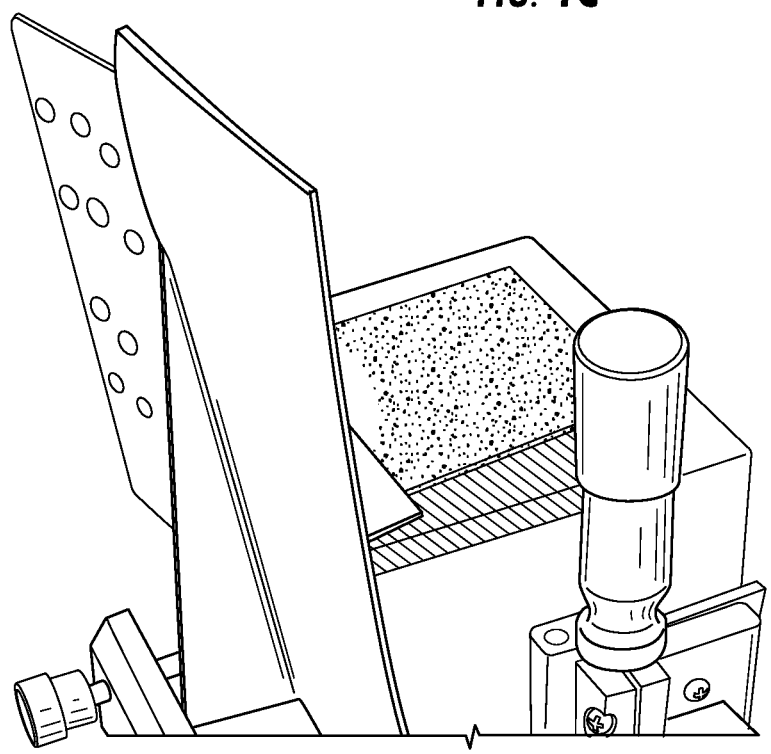
FIG. 5 is a pictorial depiction of an exemplary coating formed from some embodiments.

While the examples described herein have referenced a silsesquioxane host, a variety of host materials can be employed. For example, another exemplary host can be, but is not limited to, an alkali/silica water glass. This alkali/silica water glass host can comprise, for example, a 7-8 wt % silicate water solution of SiO$_2$/R$_2$O with R representing an alkali having a ratio varying from 1-20. Of course, other silicate water solutions can alternatively be employed, e.g., 8-20 wt %, 20-30 wt %, and greater than 30 wt %. FIG. 5 provides a pictorial depiction of an exemplary coating containing red phosphor material formed from the method described above. With reference to FIG. 5, exemplary fluorescence with an approximately 460 nm LED excitation source is illustrated having an approximately 10% by weight loading of red Eu-nitride phosphor in an alkali/silica water glass host heated at approximately 430° C. for 1 hour in air. As illustrated, the sample depicted in FIG. 5 exhibits fluorescence at the appropriate color point.

Figure 6:
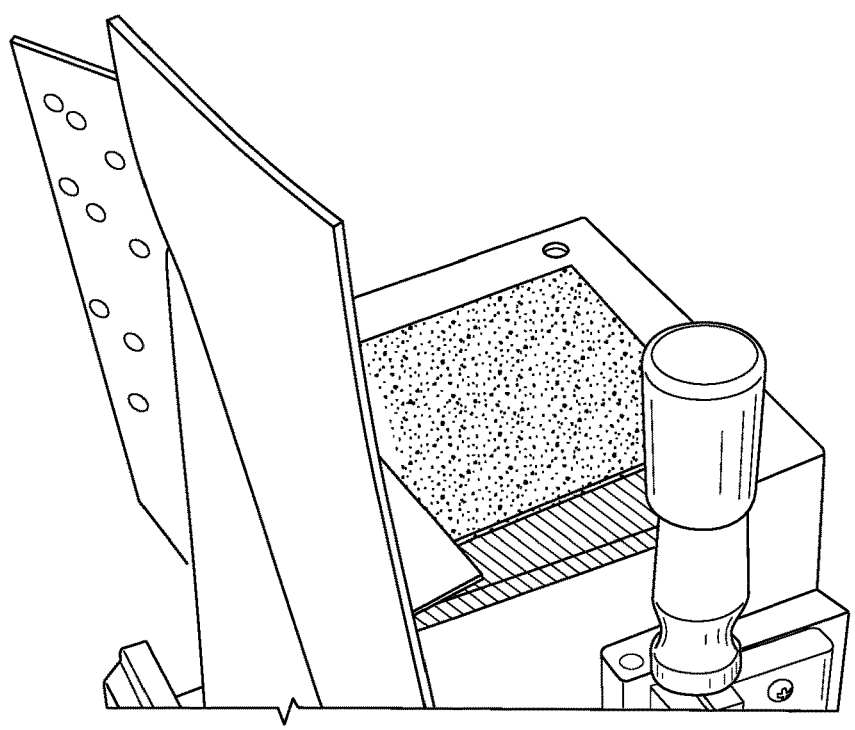
FIG. 6 is a pictorial depiction of an exemplary coating formed from some embodiments.

Yet another exemplary host can be, but is not limited to, a sol gel. Exemplary sol-gel hosts can be prepared using a mixture of tetraethylorthosilicate, water, acid and alcohol. Of course, other sol-gels can be similarly employed. In some embodiments, an alkoxide can be dissolved in alcohol and hydrolyzed by the addition of water under acidic, neutral or basic conditions. Hydrolysis can replace an alkoxide ligand with a hydroxyl followed by condensation reactions involving the hydroxyl groups to produce a polymer composed of Si—O—Si. This exemplary reaction can be employed to construct larger silicon-containing molecules through the process of polymerization to form SiO$_2$ and the reaction completed when subjected to a high temperature thermal cure. Red phosphor material, e.g., (SrBaMg)2SiO4:Eu, M(AlSi)N$_3$:Eu where M is Ca, Sr, or Ba, CaS:Eu, as well as other suitable red phosphors, can be loaded into the host matrix at approximately 10% by weight, for example. This slurry can then be then be, for example, spin-coated, sprayed, dip coated, screen printed or otherwise deposited onto an underlying substrate having yellow phosphor material to a thickness of approximately 1 μm. In some embodiments, an exemplary red phosphor powder e.g., (SrBaMg)2SiO4:Eu, M(AlSi)N$_3$:Eu where M is Ca, Sr, or Ba, CaS:Eu, as well as other suitable red phosphors, can be added to an exemplary silicate water solution thereby forming a slurry. This slurry can then be, for example, spin-coated, sprayed, dip coated, screen printed or otherwise deposited onto an underlying substrate having yellow phosphor material to a thickness of approximately 1 µm. In another embodiment, a silicate coating can be provided on top of the deposited red phosphor coating to form a capping layer and then heated to approximately 430° C. for 1 hour in air to complete the thermal treatment. In another embodiment, a prepolymerized sol-gel mix can be provided on top of the deposited red phosphor coating to form a capping layer and then heated to approximately 430° C. for 1 hour in air to complete the thermal treatment. FIG. 6 provides a pictorial depiction of an exemplary coating containing red phosphor material formed as described above. With reference to FIG. 6, exemplary fluorescence with an approximately 460 nm LED excitation source is illustrated having an approximately 10% by weight loading of red Eu-nitride phosphor in a sol-gel derived host heated at approximately 410° C.-430° C. for 1 hour in air. As illustrated, the sample depicted in FIG. 6 exhibits fluorescence at the desired color point.

Figure 7:
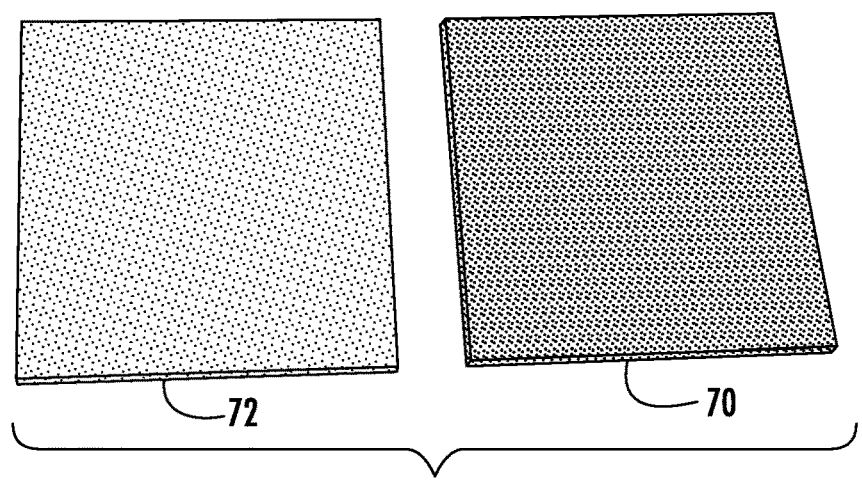
FIG. 7 illustrates a comparison of an embodiment of the present disclosure to an underlying yellow phosphor substrate.
Figure 8:
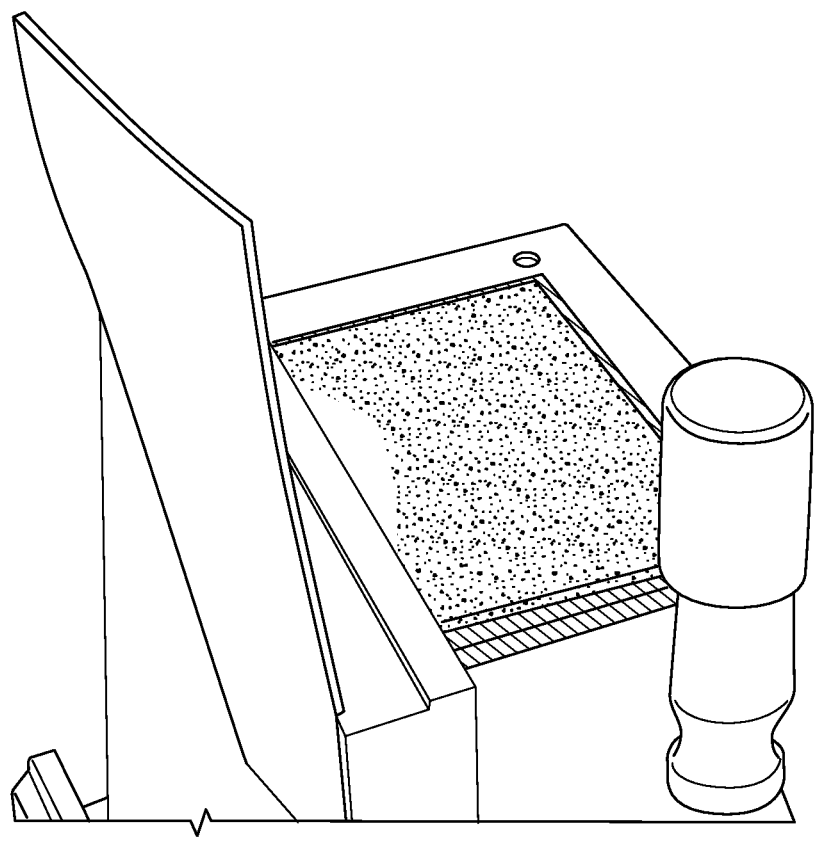
FIG. 8 is an illustration of another embodiment.

FIG. 7 illustrates a comparison of an embodiment of the present disclosure to an underlying yellow phosphor substrate. With reference to FIG. 7, a red CaS:Eu phosphor having a silsequioxane host was spin-coated onto a screen printed yellow phosphor glass target 70 as compared to the yellow phosphor (Ce/YAG in frit) glass target without such a coating 72. FIG. 8 is an illustration of another embodiment of the present disclosure. With reference to FIG. 8, a red CaS:Eu phosphor has been coated onto an underlying yellow phosphor in glass (Ce/YAG in frit) substrate. Exemplary fluorescence with an approximately 460 nm LED excitation source is illustrated that produces a warm white light in the desired emission band.

With respect to quantum dots, these materials are light emitting bodies having a diameter of 10 nm or less and exhibits a quantum confinement effect. Quantum dots generate stronger light than a typical phosphor in a narrow wavelength. The emission of a quantum dot is generated when excited electrons move from a conduction band to a valence band. As the size of the quantum dot is smaller, light having a shorter wavelength is emitted. Thus, light having a desired wavelength range can be obtained in some embodiments by adjusting the size of the quantum dot. Exemplary quantum dots can be a semiconductor nanocrystal such as, but not limited to, a Si nanocrystal, group II-VI compound semiconductor nanocrystal, group III-V compound semiconductor nanocrystal, or group IV-VI compound semiconductor nanocrystal. In the current embodiment, the quantum dots can be used solely or in mixture thereof. The group II-VI compound semiconductor nanocrystal includes, but is not limited to, CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. Furthermore, the group III-V compound semiconductor nanocrystal includes, but is not limited to, GaN, GaP, GaAs, AlN, AlP, AlAs, InN, InP, InAs, GaNP, GaNAa, GaPAs, AlNP, AlNAs, AlPAs, InNP, InNAs, InPAs, GaAlP, GaAlNAs, GaAlPAs, GaInNP, GaInAs, GaInPAs, InAlNP, InAlNAs, or InAlPAs. Moreover, the group IV-VI compound semiconductor nanocrystal can include, but is not limited to, SbTe.

Figure 11:
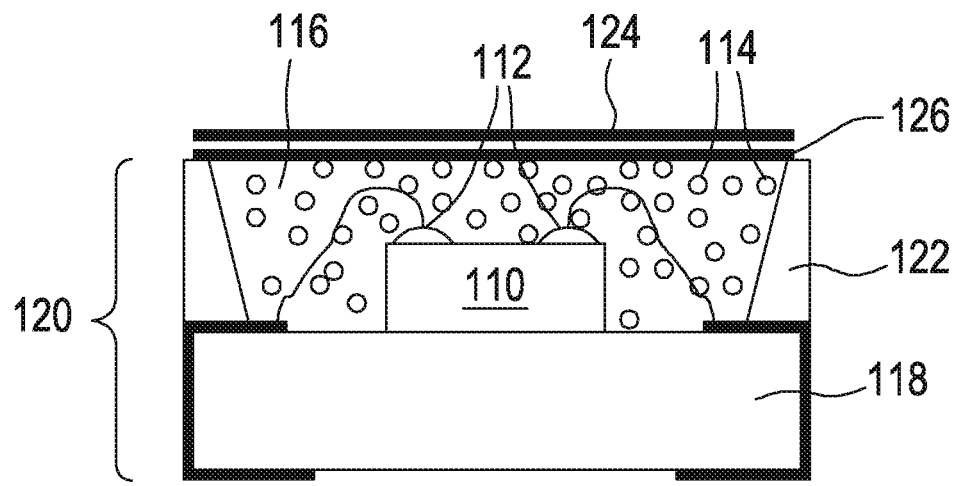
FIG. 11 is an illustration of a white light LED in a surface mount package according to some embodiments.

FIG. 11 is an illustration of a white light LED in a surface mount package. With reference to FIG. 11, in some embodiments, one or more phosphors or quantum dots can be mixed with a glass material or glass frit material (e.g., a material used to encapsulate an underlying device, layer or material) to form a phosphor-glass or quantum dot mixture. This mixture can then be applied to an LED 110, for example, a GaN or InGaN LED, within a vessel. FIG. 11 depicts the LED 110, wire bonds 112, phosphor particles 114 in a host material 116 (e.g., silicone or other suitable host material) surrounding the phosphor and/or quantum dot particles 114, a substrate 118 and a package 120 for an exemplary LED. The package 120 includes the substrate 118, an epoxy resin lens 124, and a vessel or cup 122 made from plastic or ceramic to contain the phosphor or quantum dot mixture, protect the LED 110, and to reflect the light from the package. In some embodiments, a red phosphor material can be mixed, applied onto the underlying host material 116 and phosphor particle 114 arrangement, and cured as discussed above to form a layer 126 containing the red phosphor material. In another embodiment, a capping layer (not shown) can also be applied adjacent to the layer 126 containing the red phosphor material.

Figure 12:
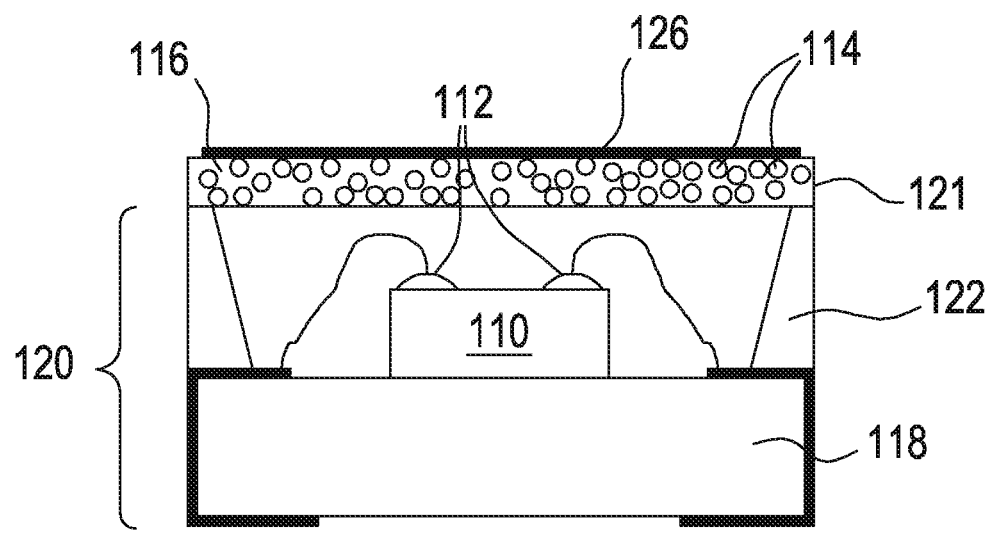
FIG. 12 is another illustration of a white light LED in a surface mount package according to embodiments.

FIG. 12 is another illustration of a white light LED in a surface mount package. With reference to FIG. 12, a phosphor and/or quantum dots 114 has been mixed with a glass or host material 116 to form a phosphor-glass or quantum dot mixture which is fired to create a glass sheet 121 having phosphor/quantum dots embedded therein. The package 120 includes an LED 110, wire bonds 112 and package substrate 118 as well as the vessel or cup 122 made from plastic or ceramic material. The phosphor- and/or quantum dot-containing glass mixture 114, 116 can be applied to a substrate by screen printing, spraying, spin coating, etc., followed by firing to produce a dense glass layer overlying the substrate 118 and package. Since the fired phosphor-containing mixture is a glass, a cover lens may not be required. A red phosphor material can be mixed, applied onto the glass sheet 121 (i.e., the phosphor-containing glass mixture 114, 116), and cured as discussed above to form a layer 126 containing the red phosphor material. In another embodiment, a capping layer (not shown) can also be applied adjacent to the layer 126 containing the red phosphor material.

Figure 13A:
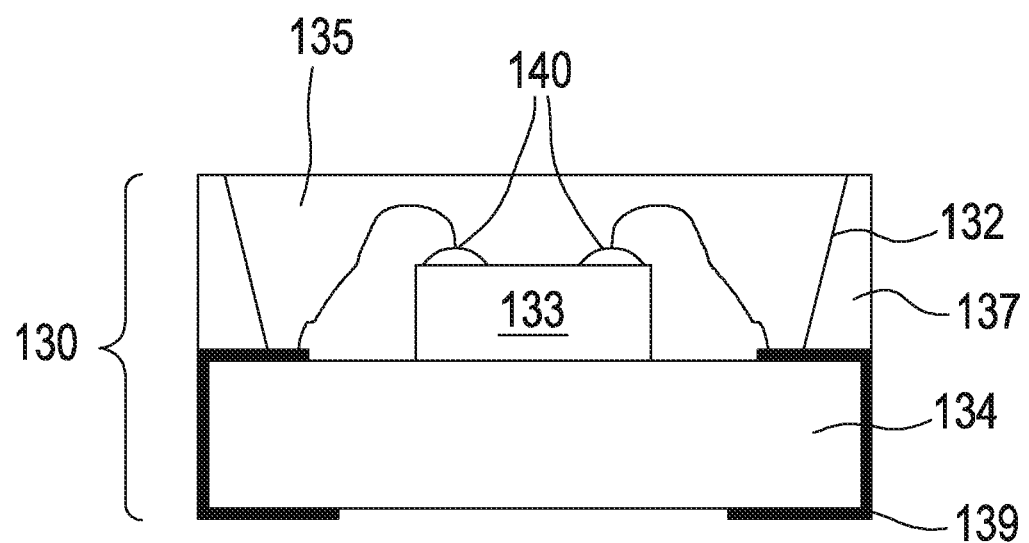
FIGS. 13A and 13B are illustrations of light emitting devices having a wavelength conversion plate according to some embodiments.
Figure 13B:
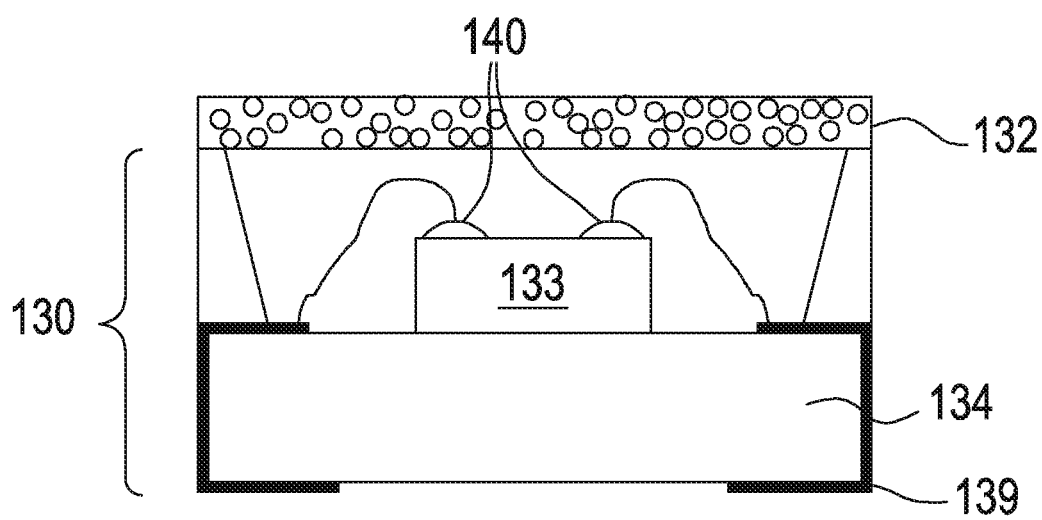

FIG. 13A is an illustration of a light emitting device having a wavelength conversion plate according to some embodiments of the present disclosure. With reference to FIG. 13A, a light emitting device 130 is illustrated having an exemplary wavelength conversion plate 132 having an underlying YAG substrate coated with one or more layers of red phosphor or quantum dot containing materials that are mixed, applied and cured as discussed above. A capping layer (not shown) can also be applied adjacent the one or more layers of red phosphor or quantum dot containing material. When the quantum dot or phosphor is included in the wavelength conversion layer of the plate 132 which an incident excitation light is converted into generate a wavelength-converted light (reflected or otherwise). While not shown, the wavelength conversion plate 132 can also include a dielectric layer, nano pattern, and metal layer. The light emitting device 130 includes a light emitting element 133 supported by a frame 134 and having an electrode 139 formed on the frame 134 and electrically connected to the light emitting element 133 by wire 140 or other suitable means. The light emitting element 133 can be encapsulated by a suitable material 135. In the embodiment depicted, the wavelength conversion plate 132 is illustrated disposed in a reflection arrangement thereby converting light into a reflection section 137 of the device 130. The wavelength conversion plate 132 can also be situated above and/or encompassing the light emitting device 130 as illustrated in FIG. 13B. The light emitting element 133 can be an LED, laser diode or the like (e.g., a GaN-based LED emitting a blue light of 420-480 nm). Exemplary encapsulation material can be, but is not limited to, epoxy, silicon, acryl-based polymer, glass, carbonate-based polymer, or a mixture thereof.

In various embodiments, Bi-containing borate glasses can be used as encapsulating materials for the underlying YAG substrate. In one case, a mixture of powdered glass and phosphor (or plurality of different phosphor powders) can be blended with a suitable organic binder (e.g., terpineol, ethylcellulose and the like), dispersant, surfactant and/or solvent. This encapsulating material, in this case a frit paste or mixture, can be deposited onto a thin, glass substrate. Examples of the substrate include, but are not limited to, high Na content aluminosilicate glasses manufactured via a fusion or other suitable process. The substrate/frit assembly can then be fired at approximately 350° C. to burn off organic constituents of the paste, and then subsequently heated to about 500-550° C. to sinter the frit to a sufficiently transparent state. The first temperature generally drives off the organic vehicle and can be determined by, for example, the boiling point of the organic vehicle or the use of vapor pressure data and can be carried out at atmospheric pressure or under vacuum. The second higher temperature used to consolidate or fire the phosphor/frit glass mixture into a dense glass can be determined by the frit material, with the provision that the softening temperature of the substrate to which the phosphor/frit glass mixture is applied should be about 100° C. higher than the consolidation or firing temperature of the phosphor/frit glass mixture. In some embodiments, the binder can be fully or substantially removed from the glass composition prior to sintering. As such, the temperature at which binder burnout occurs can be less than the sintering temperature. In further embodiments, the loading of phosphor in the sintered glass can range from about 1% to about 30% by weight, e.g., 1, 2, 5, 10, 15, 20 or 30 percent. To avoid reduction of Bi, the sintering can be carried out in an $O_2$-enriched atmosphere rather than air.

In another embodiment, a free-standing frit/phosphor film can be made by a tape casting procedure as described in co-pending U.S. application Ser. No. 13/852,048, the entirety of which is incorporated herein by reference. In some embodiments, the phosphor can comprise quantum dots having a particle size ranging from 1 to 10 nm. This phosphor/frit glass mixture can be applied as a layer on or adjacent to the active plane of a LED device. The amount of phosphor powder in the phosphor/frit glass mixture can be varied to the desired amount. The ultimate thickness of the consolidated phosphor-contain frit layer can be increased by a plurality of depositions of the phosphor/frit glass mixture. In various embodiments, the phosphor powder can be homogeneously distributed throughout the glass. In further embodiments, the distribution of phosphor powder can be localized within the glass, i.e., at one or both of the free surfaces of the glass layer.

An exemplary composition for the phosphor-frit glass mixture includes a glass comprising $Bi_2O_3$ and at least 30 mol % $B_2O_3$, at least one phosphor, which might be utilized in an application where the layer is a fired mixture of a frit comprising the $Bi_2O_3$ and $B_2O_3$ and at least one phosphor, and wherein the layer is Pb free. Another embodiment includes a glass composition comprising in mole percent 10-30% $Bi_2O_3$, greater than 0% $Na_2O$, 15-50% ZnO, $ZnF_2$, or a combination thereof, 30-55% $B_2O_3$, 0-3% $SiO_2$, 0-1% $WO_3$, 0-12% BaO, CaO, SrO, or combinations thereof. Some glass compositions can include at least 1% $Na_2O$ and can include 15-50% ZnO. In other embodiments, the glass composition comprises in mol percent 12-20% $Bi_2O_3$, 5-12% $Na_2O$, 20-30% ZnO, 38-52% $B_2O_3$, 0-3% $SiO_2$, 0-1% $WO_3$, 1-12% BaO, CaO, SrO, or combinations thereof. In some embodiments, the glass composition comprises 14-16% $Bi_2O_3$, 5-11% $Na_2O$, 22-27% ZnO, 40-51% $B_2O_3$, 0-3% $SiO_2$, 0-1% $WO_3$, 1-11% BaO, CaO, SrO, or combinations thereof. In additional embodiment, the glass composition can comprise in mole percent 10-30% $Bi_2O_3$, 0-20% $M_2O$, wherein M is Li, Na, K, Cs, or combinations thereof, 0-20% RO, wherein R is Mg, Ca, Sr, Ba, or combinations thereof, 15-50% ZnO, $ZnF_2$, or a combination thereof, 0-5% $Al_2O_3$, 0-5% $P_2O_5$, and 30-55% $B_2O_3$. Additional exemplary compositions are described in co-pending U.S. application Ser. No. 13/852,048, the entirety of which is incorporated herein by reference.

The underlying yellow phosphor (YAG) substrate can comprise a glass substrate. The glass substrate can have a thickness of about 5 mm or less, e.g., 4 mm, 3 mm, 2 mm, 1 mm, 0.5 mm or less. The glass substrate can be a thin flexible glass substrate. In some embodiments, the carrier substrate can comprise a tape or substrate from which the glass layer can be removed after the layer is made. The glass layer can be removed from the carrier and then attached to another surface after fabrication and also fired on its own. The glass layer can have a thickness of about 5 mm or less, e.g., 4 mm, 3 mm, 2 mm, 1 mm, 0.5 mm, 0.4 mm, 0.3 mm, 0.2 mm, 0.1 mm, 0.09 mm, 0.08 mm, 0.07 mm, 0.06 mm, or 0.05 mm or less. In some embodiments, the glass layer has a thickness of from about 0.01 mm to about 1 mm, e.g., from 0.01 mm to 0.2 mm.

The glass layer, on the substrate or alone, can be used to fabricate LED lights in for example, fabrication processes such as wafer sized processes, for example, 6 inches by 6 inches or even larger. Multiple LEDs can be fabricated on the glass layer and separated into single LEDs after fabrication. Devices thus having a phosphor/frit glass layer combined with an exemplary red phosphor layer are thermally more robust than when a silicone is used as the encapsulation material, and the phosphor/frit glass layer has better chemical and environmental stability.

It should be noted that in some embodiments the layer containing the red phosphor material would not include ceramic oxide precursors (e.g., compounds of various metals such as aluminum, titanium, zirconium, tantalum, niobium and/or vanadium as well as various non-metallic compounds such as those of boron or phosphorous which can be dissolved in solution, hydrolyzed, and subsequently pyrolyzed, at relatively low temperatures and relatively rapid reaction rates to form ceramic oxide coatings).

Some embodiments can include fillers, which includes, but is not limited to, various inorganic and organic fillers in a variety of morphologies including, but not limited to powders, particles, flakes, microballoons and the like. Examples of inorganic fillers include synthetic and natural materials such as the oxides, nitrides, borides and carbides of various metals and non-metals such as glass, alumina, silica, titanium dioxide, zinc oxide, tungsten oxide, and ruthenium oxide, titanates such as potassium titanate and barium titanate, niobates such as lithium niobate and lead niobate, barium sulfate, calcium carbonate, precipitated diatomite, aluminum silicate or other silicates, pigments, phosphors, metals such as silver, aluminum and copper, wollastonite, mica, kaolin, clay, talc and the like. Also, some organic materials such as cellulose, polyamides, phenol resins and the like can also be used. Preferable fillers include phosphors such as, but not limited to, sulfides, selenides and sulfoselenides such as zinc sulfide and cadmium sulfide, oxysulfides, oxygen dominant phosphors such as borates, aluminates, gallates, silicates, and the like and halide phosphors such as alkali metal halides, alkaline earth halides and oxyhalides. Exemplary phosphor compounds can also be doped with activators including, but not limited to, manganese, silver, copper, halides and the like. Suitable phosphors can be an oxide phosphor, a sulfide phosphor, and a nitride phosphor according to the conversion wavelength. For example, the phosphor can include a yellow emission (e.g., from about 570 nm to about 590 nm) phosphor based on β-SiAlON:Eu,Re, a silicate-based green emission (e.g., from about 495 nm to about 570 nm) phosphor such as (Ba,Sr,Ca,Mg)$_2$SiO$_4$:Eu,Re, or a sulfide-based green emission (e.g., from about 495 nm to about 570 nm) phosphor such as (Ba,Sr,Ca,Mg) (Ga,Al,In)$_2$ (S,Se,Te)$_4$:Eu,Re, a nitride-based red emission (e.g., from about 620 nm to about 740 nm) phosphor such as (Sr,Ca,Ba,Mg)AlSiN$_x$:Eu,Re ($1 \leq x \leq 5$), or a sulfide-based red emission (e.g., from about 620 nm to about 740 nm) phosphor such as (Sr,Ca,Ba,Mg) (S,Se,Te):Eu,Re where Re can be any one of Nd, Pm, Sm, Tb, Dy, Ho, Er, Tm, Yb, F, Cl, Br, and I. Preferably red phosphors can be, but are not limited to, (SrBaMg)2SiO4:Eu, M(AlSi)N$_3$:Eu where M is Ca, Sr, or Ba, CaS:Eu, as well as other suitable red phosphors. The particle size and shape of the above phosphor fillers can vary over a wide range depending on factors such as the type of filler, the desired coating thickness, etc. The amount of phosphor filler can also be varied over a wide range depending, for example, on the characteristics desired in the final coating.

Other materials can also be present in the coating composition. For example, materials which modify the surface of the filler for better adhesion can be used such as, for example, silanes, glycidoxypropyltrimethoxysilane, mercaptopropyl-trimethoxysilane, and vinyltriacetoxysilane, to name a few. In some embodiments, suspending agents can also be added to the coating composition.

Some embodiments of the present disclosure provide a wavelength conversion plate for converting an input wavelength to an output wavelength. The wavelength conversion plate can include a first phosphor layer including first phosphor particles distributed throughout a first matrix and a second phosphor layer including second phosphor particles distributed throughout a second matrix. In additional embodiments, the first phosphor particles are yellow emission phosphor particles and the second phosphor particles are red emission phosphor particles. In another embodiment, the second phosphor layer does not include ceramic oxide precursors. The second phosphor layer can be in physical contact with the first phosphor layer, and the second matrix includes a silsesquioxane host material, a sol gel host material, or an alkali/silicate water glass host material. In various embodiments, the output wavelength can be determined as a function of a loading of the second phosphor particles in the second matrix, thickness of the second phosphor layer, loading of the first phosphor particles in the first matrix, thickness of the first phosphor layer, and combinations thereof. In one embodiment, the composite thickness of the wavelength plate is about 100-500 microns. Exemplary second phosphor particles include, but are not limited to, (Sr,Ca,Ba,Mg)AlSiN$_x$:Eu,Re ($1 \leq x \leq 5$) particles, (Sr,Ca,Ba,Mg) (S,Se,Te):Eu,Re particles where Re can be any one of Nd, Pm, Sm, Tb, Dy, Ho, Er, Tm, Yb, F, Cl, Br, and I, (SrBaMg)2SiO4:Eu particles, M(AlSi)N$_3$:Eu particles where M is Ca, Sr, or Ba, CaS:Eu particles, and combinations thereof. Exemplary first phosphor particles include, but are not limited to, Cerium doped Yttrium aluminum garnet (YAG), and other suitable yellow phosphors. In further embodiments, the first phosphor layer, second phosphor layer or first and second phosphor layers include quantum dots. Exemplary quantum dots can be comprised of group II-VI compound semiconductor nanocrystal, group III-V compound semiconductor nanocrystal, group IV-VI compound semiconductor nanocrystals, or combinations thereof. In some embodiments, the second phosphor layer can be spin-coated, sprayed, dip-coated, or screen printed onto the first phosphor layer. Exemplary distribution of the second phosphor particles in the second matrix ranges from about 1% to about 30% by weight. In another embodiment, the wavelength conversion plate has a capping layer above the second phosphor layer, wherein the capping layer is substantially devoid of any phosphor particles. An exemplary second phosphor layer can have a low surface energy of less than about 50 mJ/m$^2$. In some embodiments, the deposited layer can have a low surface energy of less than about 40 mJ/m$^2$ and even less than about 30 mJ/m$^2$. A preferred embodiment provides a low surface energy coating of approximately 34 mJ/m$^2$.

Additional embodiments of the present disclosure include a lighting device having at least one light emitting diode adapted to emit primary light having a peak wavelength in the visible spectrum and a multi-layer structure. The multi-layer structure includes a first phosphor layer including first phosphor particles distributed throughout a first matrix and a second phosphor layer including second phosphor particles distributed throughout a second matrix whereby the second phosphor layer is in physical contact with the first phosphor layer and the second matrix includes a silsesquioxane host material, a sol gel host material, or an alkali/silicate water glass host material. In some embodiments, the first phosphor particles are yellow emission phosphor particles and the second phosphor particles are red emission phosphor particles. In another embodiment, the second phosphor layer does not include ceramic oxide precursors. In various embodiments, the output wavelength can be determined as a function of a loading of the second phosphor particles in the second matrix, thickness of the second phosphor layer, loading of the first phosphor particles in the first matrix, thickness of the first phosphor layer, and combinations thereof. Exemplary second phosphor particles include, but are not limited to, (Sr,Ca,Ba,Mg)AlSiN$_x$:Eu,Re ($1 \leq x \leq 5$) particles, (Sr,Ca,Ba,Mg) (S,Se,Te):Eu,Re particles where Re can be any one of Nd, Pm, Sm, Tb, Dy, Ho, Er, Tm, Yb, F, Cl, Br, and I, (SrBaMg)2SiO4:Eu particles, M(AlSi)N$_3$:Eu particles where M is Ca, Sr, or Ba, CaS:Eu particles, and combinations thereof. Exemplary first phosphor particles include, but are not limited to, Cerium doped Yttrium aluminum garnet (Ce:YAG), and other suitable yellow phosphors. In further embodiments, the first phosphor layer, second phosphor layer or first and second phosphor layers include quantum dots. Exemplary quantum dots can be comprised of group II-VI compound semiconductor nanocrystal, group III-V compound semiconductor nanocrystal, group IV-VI compound semiconductor nanocrystals, or combinations thereof. In some embodiments, the second phosphor layer can be spin-coated, sprayed, dip-coated, or screen printed onto the first phosphor layer. Exemplary distribution of the second phosphor particles in the second matrix ranges from about 1% to about 30% by weight. In some embodiments, the multilayer structure is positioned adjacent and above the at least one light emitting diode; in other embodiments, the multilayer structure reflects and converts incident light from the at least one light emitting diode. In another embodiment, the multilayer structure includes a capping layer above the second phosphor layer, wherein the capping layer is substantially devoid of any phosphor particles. An exemplary second phosphor layer can have a low surface energy of less than about 50 mJ/m$^2$.

In some embodiments, the deposited layer can have a low surface energy of less than about 40 mJ/m$^2$ and even less than about 30 mJ/m$^2$. A preferred embodiment provides a low surface energy coating of approximately 34 mJ/m$^2$.

Further embodiments of the present disclosure include a lighting device having at least one light emitting diode adapted to emit primary light having a peak wavelength in the visible spectrum and a multi-layer structure. The multi-layer structure can include a first phosphor layer including yellow emission phosphor particles distributed throughout a first matrix and a second phosphor layer in contact with the first phosphor layer and including red emission phosphor particles distributed throughout a second matrix whereby the second matrix includes a silsesquioxane host material, a sol gel host material, or an alkali/silicate water glass host material, and whereby the second phosphor layer does not include ceramic oxide precursors. In various embodiments, the output wavelength can be determined as a function of a loading of the second phosphor particles in the second matrix, thickness of the second phosphor layer, loading of the first phosphor particles in the first matrix, thickness of the first phosphor layer, and combinations thereof. Exemplary second phosphor particles include, but are not limited to, (Sr,Ca,Ba,Mg)AlSiN$_x$:Eu,Re (1≤x≤5) particles, (Sr,Ca,Ba,Mg) (S,Se,Te):Eu,Re particles where Re can be any one of Nd, Pm, Sm, Tb, Dy, Ho, Er, Tm, Yb, F, Cl, Br, and I, (SrBaMg)2SiO4:Eu particles, M(AlSi)N$_3$:Eu particles where M is Ca, Sr, or Ba, CaS:Eu particles, and combinations thereof. Exemplary first phosphor particles include, but are not limited to, Cerium doped Yttrium aluminum garnet (Ce:YAG), and other suitable yellow phosphors. In further embodiments, the first phosphor layer, second phosphor layer or first and second phosphor layers include quantum dots. Exemplary quantum dots can be comprised of group II-VI compound semiconductor nanocrystal, group III-V compound semiconductor nanocrystal, group IV-VI compound semiconductor nanocrystals, or combinations thereof. In some embodiments, the second phosphor layer can be spin-coated, sprayed, dip-coated, or screen printed onto the first phosphor layer. Exemplary distribution of the second phosphor particles in the second matrix ranges from about 1% to about 30% by weight. In some embodiments, the multilayer structure is positioned adjacent and above the at least one light emitting diode; in other embodiments, the multilayer structure reflects and converts incident light from the at least one light emitting diode. In another embodiment, the multilayer structure includes a capping layer above the second phosphor layer, wherein the capping layer is substantially devoid of any phosphor particles. An exemplary second phosphor layer can have a low surface energy of less than about 50 mJ/m$^2$. In some embodiments, the deposited layer can have a low surface energy of less than about 40 mJ/m$^2$ and even less than about 30 mJ/m$^2$. A preferred embodiment provides a low surface energy coating of approximately 34 mJ/m$^2$.

Some embodiments of the present disclosure provide a method of combining a first phosphor material and a second phosphor material. The method includes providing a first phosphor material, combining the first phosphor material with a host matrix to create a first phosphor mixture, curing the first phosphor mixture at one or more predetermined temperatures, and depositing the cured first phosphor mixture onto a substrate having a second phosphor material. In some embodiments, the step of depositing comprises spin-coating, spraying, dip-coating, or screen printing. In other embodiments, the first phosphor material includes red emission phosphor particles and the second phosphor material includes yellow emission phosphor particles. The host matrix can include a silsesquioxane host material, a sol gel host material, or an alkali/silicate water glass host material. In other embodiments, the first phosphor mixture does not include ceramic oxide precursors. Exemplary first phosphor materials can include, but are not limited to, (Sr,Ca,Ba,Mg)AlSiN$_x$:Eu,Re (1≤x≤5) particles, (Sr,Ca,Ba,Mg) (S,Se,Te):Eu,Re particles where Re can be any one of Nd, Pm, Sm, Tb, Dy, Ho, Er, Tm, Yb, F, Cl, Br, and I, (SrBaMg)2SiO4:Eu particles, M(AlSi)N$_3$:Eu particles where M is Ca, Sr, or Ba, CaS:Eu particles, and combinations thereof. Exemplary second phosphor materials include, but are not limited to, Cerium doped Yttrium aluminum garnet (Ce:YAG), and other suitable yellow phosphors. In another embodiment, the method includes depositing a capping layer on the first phosphor material, whereby the capping layer includes the host matrix substantially devoid of the first phosphor material. An exemplary deposited first phosphor mixture can have a low surface energy of less than about 50 mJ/m$^2$. In some embodiments, the deposited first phosphor mixture can have a low surface energy of less than about 40 mJ/m$^2$ and even less than about 30 mJ/m$^2$. A preferred embodiment provides a low surface energy coating of approximately 34 mJ/m$^2$.

Experiments

In one experiment, an exemplary silicate-methyl siloxane polymer (e.g., 512B spin on glass resin, ~10% polymer, <2 cP, Honeywell) was generated having a loading of 10% by weight of red phosphor material. Additional solvents, e.g., IPA, water, etc., were added to increase viscosity. This mixture was spin-coated onto an underlying substrate using a spin-coating mechanism at 1000 rpm for 30 sec. It was observed that the coating uniformity on the substrate was poor as the host quickly dried and large phosphor particles (greater than 10 μm) were retained on the surface thereof due to the viscosity. Further, little to no color change was observed.

In a second experiment, another silicate-methyl siloxane polymer was generated having 0.1-1% ethylene glycol (or glycerol) to increase the viscosity thereof and having a loading of 10% by weight of red phosphor material. This mixture was spin-coated onto an underlying substrate using a spin-coating mechanism at 1000 rpm for 30 sec. It was observed that the coating uniformity improved over the first experiment and large phosphor particles (greater than 10 μm) were still retained on the surface thereof. Color change also was observed with a subsequent curing process at 430° C. for 1 hour in air.

Figure 9:
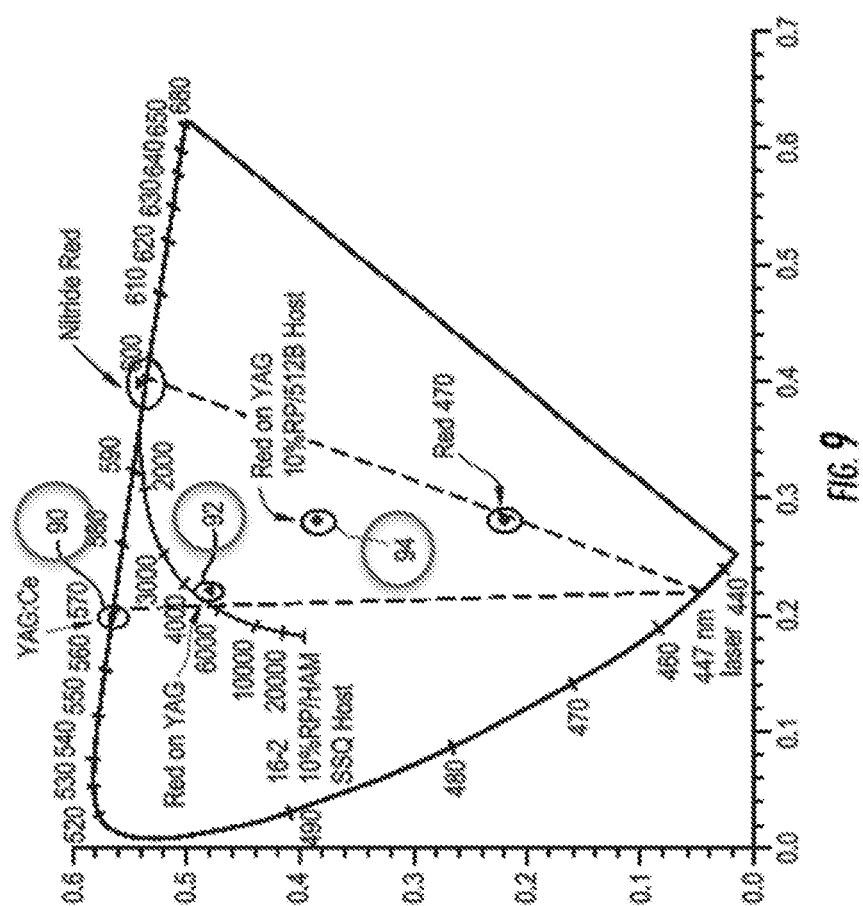
FIG. 9 is a chromaticity plot showing various color points convolved with eye response with certain embodiments.

In a third experiment, a HardSil AM curable polysilsesquioxane T-resin polymer was obtained (19-21% solids, viscosity 5-15 cSt., dynamic viscosity approximately 4-14 cP) and 10% by weight of red phosphor material was mixed therein. This mixture was spin-coated onto an underlying substrate using a spin-coating mechanism at 1000 rpm for 35 sec and then cured according to a predetermined heat schedule, namely, the structure was cured at 50° C. and then the temperature increased at a rate of 40° C./min to 240° C. whereby the structure was cured for 0.5 hours. The temperature was then increased 5° C./min to 430° C. whereby the structure was cured for 1 hour. The temperature was then allowed to decrease at a rate of 5° C./min to 60° C. A second coat of the mixture was spin-coated on the substrate using a spin-coating mechanism at 1000 rpm for 35 sec. A HardSil AM curable polysilsesquioxane T-resin polymer cap layer was then spin-coated onto this second coat as a capping layer and the composite cured according to the same heat schedule. The quantum efficiency (QE) for this composite was measured to be greater than 85% indicating that the curing schedule and any interaction with the silsequioxane polymer did not degrade the red phosphor material. Color point information for this composite was obtained and plotted in FIG. 9. FIG. 9 is a chromaticity plot or color table, showing various color points convolved with eye response with certain embodiments of the present disclosure. With reference to FIG. 9, it can be seen that a YAG:Ce color point 90 lies at 570 nm whereas a red on YAG embodiment having a HardSil AM resin in a silsesquioxane host provides another color point 92. Some embodiments of a red phosphor material overlying a YAG substrate having a 512B host and processed as noted in the third experiment exhibits an exemplary color point 94. Movement of the color point 94, i.e., modification of emitted or converted white light, can be obtained by adding or subtracting red phosphor material as a function of film thickness and/or EuN loading as well as the YAG content in the underlying substrate. It was also observed that the coating uniformity of this third composite improved over the first and second experiments and large phosphor particles (greater than 10 μm) were still retained on the surface thereof. No color change was observed with the curing process.

QE data were also generated for additional experiments. In these measurements the iris of an exemplary QE measurement system was widened to a spot size of approximately 2.2 mm×0.5 mm whereby a YAG tape cast sample was measured at 102.2% (corrected to 96%). Table 1 provides a listing of QE measurements for some embodiments having a Eu/N silsesquioxane spun-coated red phosphor material layered onto an underlying yellow phosphor substrate and cured at approximately at 430° C. in air for 1 hour

TABLE 1

| Notation | QE % | QE % (corrected) |
|---|---|---|
| YAG tape cast | 102.2 | 96.0 |
| Red nitride powder | 95.2 | 89.4 |
| 10% Eu/N with HardSil AM resin on YAG tape cast Piece 1 | 90.5 | 85.0 |
| 10% Eu/N with HardSil AM resin on YAG tape cast Piece 2 | 89.2 | 83.8 |
| 10% Eu/N with HardSil AM curable resin on YAG tape cast Piece 3 | 90.8 | 85.3 |
| 10% Eu/N with HardSil AM curable resin on glass | 97.54 | |

TABLE 2

| Notation | QE (%) (uncorrected) |
|---|---|
| Reference_11e_ . . . _034 | 99.6 |
| 17_4_HAM_red1_430 C. | 41.31 |
| 17_3_HAM_red2_300 C. | 91.91 |
| Reference_11e_ . . . _035 | 99.51 |
| 17_2_HAM_red3_250 C. | 95.99 |
| 17_1_HAM_red4_no thermal treatment | 105.5 |
| Reference_11e_ . . . _036 | 99.75 |
| 17_1_HAM_red5_no thermal treatment | 104.0 |

Figure 10:
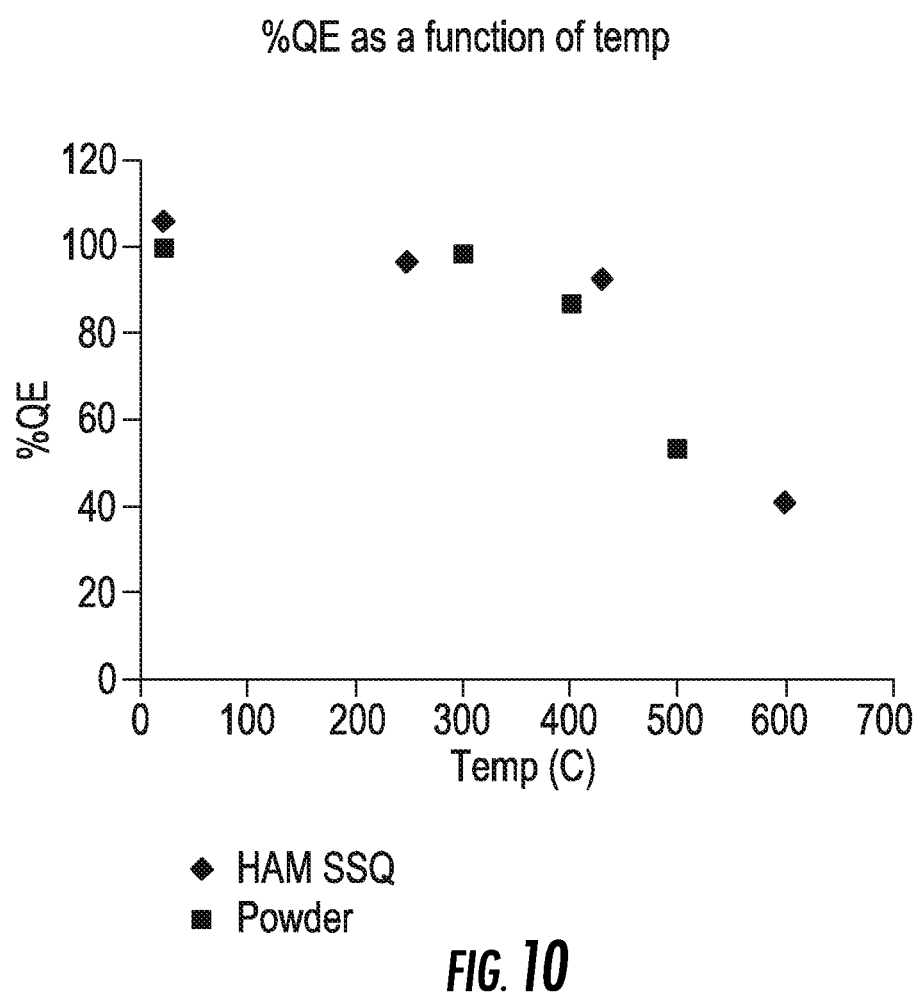
FIG. 10 is a plot of quantum efficiency versus temperature.

FIG. 10 is a plot of quantum efficiency versus temperature. With reference to FIG. 10, red phosphor powders were provided in a silsesquioxane host and spin-coated as described above. In this experiment, cure conditions were at room temperature, approximately 250° C., 430° C., and 600° C. for 1 hour in air. As illustrated, QE notably decreases from a 430° C. inflection point to 600° C. but remained substantially the same below 430° C. Thus, no significant changes were observed with the thermal stability of embodiments of the present disclosure until approximately 430° C. and it was also observed that no reactivity of the phosphor material occurred with the host material, however, some reactivity was observed with dispersants employed for formulating the hosts.

In a further experiment, a HardSil AM curable polysilsesquioxane T-resin polymer was obtained (19-21% solids, viscosity 5-15 cSt., Dynamic viscosity approximately 4-14 cP) and quantum dots were mixed therein. Exemplary, non-limiting quantum dot material, QSP 650 nm with CdSe—Zn shell, was added to the polymer host resulting in a 15 to 62 mg/ml concentration of quantum dots in the host. This mixture was spin-coated onto an underlying substrate using a spin-coating mechanism at 1000 rpm for 10 sec and a HardSil AM curable polysisesquiozane T-resin polymer cap layer was then spin-coated onto this second coat as a capping layer. This composite was then cured according to a predetermined heat schedule, namely, the structure was cured at 120° C., and then cured at 240° C. The temperature was then increased 5° C./min to 430° C. whereby the structure was cured for 1 hour. The temperature was then allowed to decrease at a rate of 5° C./min to 60° C. In another set of samples, exemplary, non-limiting quantum dot material, QSP 650 nm with CdSe—Zn shell, was added to the polymer host resulting in a 15 to 62 mg/ml concentration of quantum dots in the host. This mixture was spin-coated onto an underlying substrate using a spin-coating mechanism at 1000 rpm for 10 sec. No capping layer was added. QE for QSP 650 powder as obtained was 50% (according to manufacturer) and it was discovered that QE for each of these composites was 26-35% as the cure temperature increased.

While this description can include many specifics, these should not be construed as limitations on the scope thereof, but rather as descriptions of features that can be specific to particular embodiments. Certain features that have been heretofore described in the context of separate embodiments can also be implemented in combination in a single embodiment. Conversely, various features that are described in the context of a single embodiment can also be implemented in multiple embodiments separately or in any suitable subcombination. Moreover, although features can be described above as acting in certain combinations and can even be initially claimed as such, one or more features from a claimed combination can in some cases be excised from the combination, and the claimed combination can be directed to a subcombination or variation of a subcombination.

Similarly, while operations are depicted in the drawings or figures in a particular order, this should not be understood as requiring that such operations be performed in the particular order shown or in sequential order, or that all illustrated operations be performed, to achieve desirable results. In certain circumstances, multitasking and parallel processing can be advantageous.

As shown by the various configurations and embodiments illustrated in FIGS. 1-13, various embodiments for luminescent coatings and devices have been described.

While preferred embodiments of the present disclosure have been described, it is to be understood that the embodiments described are illustrative only and that the scope of the invention is to be defined solely by the appended claims when accorded a full range of equivalence, many variations and modifications naturally occurring to those of skill in the art from a perusal hereof.

What is claimed is:

1. A wavelength conversion plate comprising:
   a first phosphor layer comprising yellow emission phosphor particles distributed in a first matrix, the first phosphor layer emitting light having a first wavelength; and
   a second outer phosphor layer comprising red emission phosphor particles distributed in a second matrix and excluding the yellow phosphor emission particles, the second outer phosphor layer emitting light having a second wavelength, wherein the first wavelength is less than the second wavelength,
   wherein the first phosphor layer is disposed between a light-emitting device and the second outer phosphor layer, and wherein the second outer phosphor layer is in physical contact with the first phosphor layer, and
   wherein the second matrix comprises a silsesquioxane host material, a silsesquioxane-silicate host material, or an alkali/silicate water glass host material.

2. The wavelength conversion plate of claim 1, wherein the second outer phosphor layer does not include ceramic oxide precursors.

3. The wavelength conversion plate of claim 1 wherein the output wavelength is determined as a function of at least one of the loading of the red emission phosphor particles in the second matrix, thickness of the second outer phosphor layer, loading of the yellow emission phosphor particles in the first matrix, thickness of the first phosphor layer, and combinations thereof.

4. The wavelength conversion plate of claim 1, wherein the thickness of the wavelength plate is about 100 to 500 microns.

5. The wavelength conversion plate of claim 1, wherein the red emission phosphor particles are selected from the group consisting of $(Sr,Ca,Ba,Mg)AlSiN_x:Eu,Re$ ($1 \le x \le 5$) particles, $(Sr,Ca,Ba,Mg)(S,Se,Te):Eu,Re$ particles where Re can be any one of Nd, Pm, Sm, Tb, Dy, Ho, Er, Tm, Yb, F, Cl, Br, and I, $(SrBaMg)_2SiO_4:Eu$ particles, $M(AlSi)N_3:Eu$ particles where M is Ca, Sr, or Ba, CaS:Eu particles, and combinations thereof and wherein the first phosphor particles comprise Ce:YAG.

6. The wavelength conversion plate of claim 1, wherein at least one of the first and second outer phosphor layers comprise quantum dots comprised of group II-VI compound semiconductor nanocrystal, group III-V compound semiconductor nanocrystal, group IV-VI compound semiconductor nanocrystals, or combinations thereof.

7. The wavelength conversion plate of claim 1, wherein the red emission phosphor particles are distributed in the second matrix at a loading of from about 1% to about 30% by weight.

8. The wavelength conversion plate of claim 1, further comprising a capping layer above the second outer phosphor layer, wherein the capping layer is substantially devoid of any phosphor particles.

9. The wavelength conversion plate of claim 1, wherein the second outer phosphor layer has a surface energy of less than about 50 mJ/m$^2$, less than about 40 mJ/m$^2$, or less than about 30 mJ/m$^2$.

10. A lighting device comprising:
    at least one light emitting diode adapted to emit primary light having a peak wavelength in the visible spectrum; and
    a multi-layer structure having:
       a first phosphor layer including yellow emission phosphor particles in a first matrix, the first phosphor layer emitting light having a first wavelength,
       a second outer phosphor layer including red emission phosphor particles and excluding the yellow emission phosphor particles in a second matrix, the second outer phosphor layer emitting light having a second wavelength, wherein the first wavelength is less than the second wavelength,
    wherein the first phosphor layer is disposed between the at least one light emitting diode and the second outer phosphor layer, and the second outer phosphor layer is in physical contact with the first phosphor layer and
    wherein the second matrix includes a silsesquioxane host material, silsesquioxane-silicate host material or an alkali/silicate water glass host material.

11. The lighting device of claim 10, wherein the second phosphor layer does not include ceramic oxide precursors.

12. The lighting device of claim 10, wherein the output wavelength is determined as a function of at least one of the loading of the red emission phosphor particles in the second matrix, thickness of the second phosphor layer, loading of the yellow emission phosphor particles in the first matrix, thickness of the first phosphor layer, and combinations thereof.

13. The lighting device of claim 10, wherein the red emission phosphor particles are selected from the group consisting of $(Sr,Ca,Ba,Mg)AlSiN_x:Eu,Re$ ($1 \le x \le 5$) particles, $(Sr,Ca,Ba,Mg)(S,Se,Te):Eu,Re$ particles where Re can be any one of Nd, Pm, Sm, Tb, Dy, Ho, Er, Tm, Yb, F, Cl, Br, and I, $(SrBaMg)_2SiO_4:Eu$ particles, $M(AlSi)N_3:Eu$ particles where M is Ca, Sr, or Ba, CaS:Eu particles, and combinations thereof and wherein the first phosphor particles comprise Ce:YAG.

14. The lighting device of claim 10, wherein at least one of the first and second phosphor layers include quantum dots comprised of group II-VI compound semiconductor nanocrystal, group III-V compound semiconductor nanocrystal, group IV-VI compound semiconductor nanocrystals, or combinations thereof.

15. The lighting device of claim 10 wherein the red emission phosphor particles are distributed in the second matrix from about 1% to about 30% by weight.

16. The lighting device of claim 10 wherein the multilayer structure further comprises a capping layer above the second phosphor layer, wherein the capping layer is substantially devoid of any phosphor particles.

17. The lighting device of claim 10 wherein the second phosphor layer has a surface energy of less than about 50 mJ/m$^2$, less than about 40 mJ/m$^2$, or less than about 30 mJ/m$^2$.

18. A lighting device comprising:
    at least one light emitting diode adapted to emit primary light having a peak wavelength in the visible spectrum; and
    a multi-layer structure having:
       a first phosphor layer including yellow emission phosphor particles distributed throughout a first matrix, the first phosphor layer emitting light having a first wavelength,
       a second outer phosphor layer in contact with the first phosphor layer, the first phosphor layer being disposed between the second outer phosphor layer and the at least one light emitting diode, the second outer phosphor layer including red emission phosphor particles distributed throughout a second matrix and excluding the yellow emission phosphor particles therefrom, the second outer phosphor layer emitting light having a second wavelength, wherein the second wavelength is greater than the first wavelength, wherein the second matrix includes a silsesquioxane host material, silsesquioxane-silicate host material or an alkali/silicate water glass host material, and wherein the second outer phosphor layer does not include ceramic oxide precursors.

19. The lighting device of claim 18, wherein the red emission phosphor particles are selected from the group consisting of $(Sr,Ca,Ba,Mg)AlSiN_x:Eu,Re$ ($1 \leq x \leq 5$) particles, $(Sr,Ca,Ba,Mg)(S,Se,Te):Eu,Re$ particles where Re can be any one of Nd, Pm, Sm, Tb, Dy, Ho, Er, Tm, Yb, F, Cl, Br, and I, $(SrBaMg)_2SiO_4:Eu$ particles, $M(AlSi)N_3:Eu$ particles where M is Ca, Sr, or Ba, CaS:Eu particles, and combinations thereof and wherein the yellow emission phosphor particles comprise Ce:YAG.

20. The lighting device of claim 18, wherein the first phosphor layer, second phosphor layer or first and second phosphor layers include quantum dots and wherein the quantum dots are comprised of group II-VI compound semiconductor nanocrystal, group III-V compound semiconductor nanocrystal, group IV-VI compound semiconductor nanocrystals, or combinations thereof.

21. The lighting device of claim 18, wherein the red emission phosphor particles are distributed in the second matrix from about 1% to about 30% by weight.

22. A method of combining a first red emission phosphor material and a second yellow emission phosphor material comprising the steps of:

providing a first red emission phosphor material;

combining the first red emission phosphor material with a host matrix to create a first phosphor mixture and excluding the second yellow emission materials therefrom, the host matrix comprising a silsesquioxane host material, a silsesquioxane-silicate host material, or an alkali/silicate water glass host material;

curing the first phosphor mixture at one or more predetermined temperatures wherein the cured phosphor mixture emits light having a second wavelength; and depositing the cured first phosphor mixture onto a substrate having the second yellow emission phosphor material, the second yellow phosphor material emitting light having a first wavelength that is greater than the second wavelength wherein the substrate is disposed on a light-emitting device.

23. The method of claim 22 wherein the step of depositing comprises spin-coating, spraying, dip-coating, or screen printing.

24. The method of claim 22 wherein the first phosphor mixture does not include ceramic oxide precursors.

25. The method of claim 22 wherein the first red emission phosphor material is selected from the group consisting of $(Sr,Ca,Ba,Mg)AlSiN_x:Eu,Re$ ($1 \leq x \leq 5$) particles, $(Sr,Ca,Ba,Mg)(S,Se,Te):Eu,Re$ particles where Re can be any one of Nd, Pm, Sm, Tb, Dy, Ho, Er, Tm, Yb, F, Cl, Br, and I, $(SrBaMg)_2SiO_4:Eu$ particles, $M(AlSi)N_3:Eu$ particles where M is Ca, Sr, or Ba, CaS:Eu particles, and combinations thereof and wherein the second phosphor material is comprised of Ce:YAG.

* * * * *

UNITED STATES PATENT AND TRADEMARK OFFICE
CERTIFICATE OF CORRECTION

PATENT NO. : 10,439,109 B2
APPLICATION NO. : 14/910391
DATED : October 8, 2019
INVENTOR(S) : Nicholas Francis Borrelli et al.

Page 1 of 1

It is certified that error appears in the above-identified patent and that said Letters Patent is hereby corrected as shown below:

On the Title Page

On page 2, in Column 2, item (56), Other Publications, Line 7, delete ""Enhanged" and insert -- "Enhanced --, therefor.

In the Claims

In Column 20, Line 6, Claim 22, delete "temperatures" and insert -- temperatures, --, therefor.

Signed and Sealed this
Eleventh Day of February, 2020

Andrei Iancu
*Director of the United States Patent and Trademark Office*